(12) United States Patent
Wang et al.

(10) Patent No.: US 12,255,499 B2
(45) Date of Patent: Mar. 18, 2025

(54) POWER TOOL AND ELECTRONIC CONTROL DEVICE

(71) Applicant: Nanjing Chervon Industry Co., Ltd., Nanjing (CN)

(72) Inventors: Huaishu Wang, Nanjing (CN); Baoshan Li, Nanjing (CN); Junya Duan, Nanjing (CN); Jifeng Feng, Nanjing (CN); Yanfeng Fan, Nanjing (CN); Yuemei Min, Nanjing (CN); Peng Teng, Nanjing (CN); Qingsong Yang, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 370 days.

(21) Appl. No.: 17/744,146

(22) Filed: May 13, 2022

(65) Prior Publication Data
US 2022/0271624 A1    Aug. 25, 2022

Related U.S. Application Data

(63) Continuation of application No. PCT/CN2020/077756, filed on Mar. 4, 2020.

(30) Foreign Application Priority Data

Dec. 30, 2019  (CN) .......................... 201911394525.7

(51) Int. Cl.
*H02K 11/00* (2016.01)
*B25F 5/00* (2006.01)
(Continued)

(52) U.S. Cl.
CPC .......... *H02K 11/0094* (2013.01); *B25F 5/008* (2013.01); *H02K 7/145* (2013.01); *H02K 9/00* (2013.01); *H05K 7/1427* (2013.01)

(58) Field of Classification Search
CPC .............. F04B 39/0038; F04B 39/0072; F04C 18/356; F04C 2240/804; F04C 2240/805;
(Continued)

(56) References Cited

U.S. PATENT DOCUMENTS 9,833,890 B2 * 12/2017 Ito .............................. B25F 5/00
2006/0267548 A1 * 11/2006 Uehlein-Proctor ... H02J 7/0045
320/107
(Continued)

FOREIGN PATENT DOCUMENTS

CN        101758488 A      6/2010
CN        203896633 U     10/2014
(Continued)

OTHER PUBLICATIONS

ISA/CN, English translation of Int. Search Report issued on PCT application No. PCT/CN2020/077756, dated Oct. 12, 2020, 2 pages.
(Continued)

*Primary Examiner* — Naishadh N Desai
(74) *Attorney, Agent, or Firm* — Greenberg Traurig, LLP (57) ABSTRACT

A power tool includes a main body and a battery pack. The main body includes a housing and a motor, a switch assembly, and an electronic control device. The electronic control device is electrically connected to the switch assembly and the motor. The electronic control device includes an electronic control assembly, a mounting base, and a connecting assembly. The electronic control assembly includes a power circuit board. The power circuit board is provided with an opening. The connecting assembly conductively connects the battery pack to the electronic control assembly, connects to the mounting base via the opening, and mates with the mounting base to form a mounting space in which the electronic control assembly is mounted.

19 Claims, 10 Drawing Sheets

(51) Int. Cl.
*H02K 7/14* (2006.01)
*H02K 9/00* (2006.01)
*H05K 7/14* (2006.01)

(58) Field of Classification Search
CPC ............ F04C 2240/806; F04C 2270/12; F04C 23/008; F04C 29/12; F25B 1/10; F25B 31/023; F25B 43/006; B25F 5/008; B25F 5/02; H02K 11/0094; H02K 7/145; H02K 9/00; H05K 7/1427
See application file for complete search history.

(56) References Cited

U.S. PATENT DOCUMENTS

| | | | |
|---|---|---|---|
| 2007/0224492 A1* | 9/2007 | Scott | H01M 50/247 |
| | | | 429/99 |
| 2014/0151079 A1* | 6/2014 | Furui | H02J 7/0042 |
| | | | 173/171 |
| 2019/0296608 A1* | 9/2019 | Mergener | H02K 5/04 |
| 2019/0363651 A1* | 11/2019 | Wang | H02K 5/225 |
| 2020/0238497 A1* | 7/2020 | Wang | H02K 11/33 |
| 2021/0304985 A1* | 9/2021 | Yamagata | H05K 7/1427 |
| 2022/0271624 A1* | 8/2022 | Wang | H02K 11/0094 |

FOREIGN PATENT DOCUMENTS

| | | |
|---|---|---|
| CN | 101925278 A | 5/2015 |
| CN | 205320371 U | 6/2016 |
| CN | 205690117 U | 11/2016 |
| CN | 206149617 U | 5/2017 |
| CN | 206632411 U | 11/2017 |
| CN | 106926096 A | 1/2020 |
| JP | 5086835 B2 | 11/2012 |
| JP | 2017213620 A | 12/2017 |

OTHER PUBLICATIONS

ISA/CN, Int. Search Report issued on PCT application No. PCT/CN2020/077756, dated Oct. 12, 2020, 3 pages.
ISA/CN, English translation of Written Opinion issued on PCT application No. PCT/CN2020/077756, dated Oct. 12, 2020, 3 pages.
ISA/CN, Written Opinion issued on PCT application No. PCT/CN2020/077756, dated Oct. 12, 2020, 3 pages.

* cited by examiner

POWER TOOL AND ELECTRONIC CONTROL DEVICE

RELATED APPLICATION INFORMATION

This application is a continuation of International Application Number PCT/CN2020/077756, filed on Mar. 4, 2020, through which this application also claims the benefit under 35 U.S.C. § 119(a) of Chinese Patent Application No. 201911394525.7, filed on Dec. 30, 2019, all of which are incorporated herein by reference in their entirety.

BACKGROUND

With the development of the technology of electronic control assemblies such as a printed circuit board (PCB), electronic control assemblies are applied more and more extensively. However, a PCB assembly in the related art has the problems below. The PCB assembly is connected to a power supply through a soft connection such as wires. Since connection terminals between wires and electrical elements have relatively poor stability, a connection failure easily occurs during use due to external causes such as vibration or aging, which results in low reliability, affects a service life, and increases a maintenance cost. Moreover, the wiring method of wires is complicated, which is not conducive to arranging structures within a housing and increases the manufacturing difficulty and cost of a production line. In addition, the PCB assembly in the related art has only basic functions such as control and driving, has a low integration degree, is not compact in structure, and occupies a relatively large space, which is not conducive to the miniaturization and sophistication of the whole machine.

SUMMARY

A power tool includes a main body and a battery pack. The main body includes a housing, and a motor, a switch assembly, and an electronic control device which are mounted in the housing, where the electronic control device is electrically connected to the switch assembly and the motor, separately. The battery pack is detachably coupled to the main body and has a connection state in which electricity is conducted between the battery pack and the electronic control device and a separate state in which the battery pack is disconnected from the electronic control device. The electronic control device includes an electronic control assembly, a mounting base, and a connecting assembly. The electronic control assembly includes a power circuit board which is made of a metal substrate. The power circuit board is in contact with the mounting base which is a metal base and provided with an opening. The connecting assembly for conductively connecting the battery pack to the electronic control assembly is inserted to the mounting base via the opening and mates with the mounting base to form a mounting space in which the electronic control assembly is mounted.

In one example, the electronic control assembly further includes a control circuit board, where the control circuit board and the power circuit board are stacked within the mounting base.

In one example, the mounting base includes a baseplate and wall plates, where the wall plates are disposed along an edge of the baseplate and provided with the opening.

In one example, the connecting assembly includes a connection base and a conduction member disposed on the connection base, where the connection base is pluggably connected to the baseplate via the opening, and the conduction member connects the electronic control device to the battery pack.

In one example, the conduction member includes an electronic control conduction member and a power supply conduction member, which are conductively connected to each other, and a conductive limiting member is disposed on the power circuit board, where the conductive limiting member conductively mates with the electronic control conduction member and limits the power circuit board.

In one example, the electronic control device further includes a blocking assembly which is connected to the wall plates so as to block the opening; and the blocking assembly is provided with engaging grooves slidably connected to wall plates on two sides of the opening.

In one example, the mounting base further includes heat dissipation fins disposed on a side of the baseplate facing away from the electronic control assembly, and heat dissipation channels are formed between the heat dissipation fins.

In one example, part or all of the heat dissipation fins extend onto the wall plates to form flow guiding fins, flow guiding channels are formed between the flow guiding fins, and the flow guiding channels communicate with the heat dissipation channels.

In one example, the housing is provided with an air inlet and an air outlet, and the flow guiding channels on the mounting base are docked with the air inlet.

In one example, the power tool further includes a displacement compensation assembly disposed at a position where an inner wall of the housing is in contact with the electronic control device.

In an example of the present application, a power tool is provided. The power tool includes a main body and a battery pack. The main body includes a housing, and a motor, a switch assembly, and an electronic control device which are mounted in the housing, where the electronic control device is electrically connected to the switch assembly and the motor, separately. The battery pack is detachably coupled to the main body and has a connection state in which electricity is conducted between the battery pack and the electronic control device and a separate state in which the battery pack is disconnected from the electronic control device. The electronic control device includes an electronic control assembly, a mounting base, a connecting assembly, and a blocking assembly. The electronic control assembly includes a power circuit board. The mounting base is provided with an opening. The connecting assembly for conductively connecting the battery pack to the electronic control assembly is inserted to the mounting base via the opening and mates with the mounting base to form a mounting space in which the electronic control assembly is mounted. The blocking assembly is inserted into the opening to prevent a sealant from flowing out from the opening.

In one example, the mounting base includes a baseplate and wall plates, where the wall plates are disposed along an edge of the baseplate and provided with the opening.

In one example, the blocking assembly is provided with engaging grooves slidably connected to wall plates on two sides of the opening.

In one example, the electronic control assembly further includes a control circuit board, where the control circuit board and the power circuit board are stacked within the mounting base, and the power circuit board is in contact with the mounting base.

In one example, the connecting assembly includes a connection base and a conduction member disposed on the connection base, where the connection base is inserted to the baseplate, the conduction member includes an electronic control conduction member and a power supply conduction member, which are conductively connected to each other, and a conductive limiting member is disposed on the power circuit board, where the conduction member conductively mates with the electronic control conduction member and limits the power circuit board.

In one example, the conduction member includes an electronic control conduction member and a power supply conduction member, which are conductively connected to each other, and the conductive limiting member is disposed on the power circuit board, where the conductive limiting member conductively mates with the electronic control conduction member and limits the power circuit board.

In one example, the mounting base further includes heat dissipation fins disposed on a side of the baseplate facing away from the electronic control assembly, and heat dissipation channels are formed between the heat dissipation fins.

In one example, part or all of the heat dissipation fins extend onto the wall plates to form flow guiding fins, flow guiding channels are formed between the flow guiding fins, and the flow guiding channels communicate with the heat dissipation channels.

In one example, the housing is provided with an air inlet and an air outlet, and the flow guiding channels on the mounting base are docked with the air inlet.

In one example, the power tool further includes a displacement compensation assembly disposed at a position where an inner wall of the housing is in contact with the electronic control device.

In an example of the present application, a power tool is provided. The power tool includes a main body and a battery pack. The main body includes a housing, and a motor, a switch assembly, and an electronic control device which are mounted in the housing, where the electronic control device is electrically connected to the switch assembly and the motor, separately. The battery pack is detachably coupled to the main body and has a connection state in which electricity is conducted between the battery pack and the electronic control device and a separate state in which the battery pack is disconnected from the electronic control device. The electronic control device includes an electronic control assembly, a mounting base, and a connecting assembly. The electronic control assembly includes a power circuit board. The mounting base dissipates heat from at least the power circuit board and is provided with a mounting portion. The connecting assembly for conductively connecting the battery pack to the electronic control assembly mates with and is connected to the mounting base via the mounting portion to form a mounting space in which the electronic control assembly is mounted.

In one example, the electronic control assembly further includes a control circuit board, where the control circuit board and the power circuit board are stacked within the mounting base, and the power circuit board is in contact with the mounting base.

In one example, the control circuit board and the power circuit board are pluggably connected to each other via electrical connectors.

In one example, the mounting base includes a baseplate and wall plates, where the wall plates are disposed along an edge of the baseplate and provided with an opening, the opening forms the mounting portion, and the connecting assembly is inserted to the baseplate via the opening.

In one example, the electronic control device further includes a blocking assembly which is connected to the wall plates so as to block the opening; and the blocking assembly is provided with engaging grooves slidably connected to wall plates on two sides of the opening.

In one example, the connecting assembly includes a connection base and a conduction member disposed on the connection base, where the conduction member includes an electronic control conduction member and a power supply conduction member, which are conductively connected to each other; and a conductive limiting member is disposed on the power circuit board, where the conductive limiting member conductively mates with the electronic control conduction member and limits the power circuit board.

In one example, the conductive limiting member includes connection holes disposed on the power circuit board, and the electronic control conduction member is suitable for penetrating into the connection holes.

In one example, the mounting base further includes heat dissipation fins disposed on a side of the baseplate facing away from the electronic control assembly, and heat dissipation channels are formed between the heat dissipation fins.

In one example, part or all of the heat dissipation fins extend onto the wall plates to form flow guiding fins, flow guiding channels are formed between the flow guiding fins, and the flow guiding channels communicate with the heat dissipation channels.

In one example, the housing is provided with an air inlet and an air outlet, and the flow guiding channels on the mounting base are docked with the air inlet.

In one example, the power tool further includes a displacement compensation assembly disposed at a position where an inner wall of the housing is in contact with the electronic control device.

In an example of the present application, an electronic control device is provided. The electronic control device includes an electronic control assembly, a mounting base, and a connecting assembly. The electronic control assembly includes a power circuit board. The mounting base dissipates heat from at least the power circuit board and is provided with a mounting portion. The connecting assembly for conductively connecting the battery pack to the electronic control assembly mates with and is connected to the mounting base via the mounting portion to form a mounting space in which the electronic control assembly is mounted.

In one example, the electronic control assembly further includes a control circuit board, where the control circuit board and the power circuit board are stacked within the mounting base, and the power circuit board is in contact with the mounting base.

In one example, the control circuit board and the power circuit board are pluggably connected to each other via electrical connectors.

In one example, the mounting base includes a baseplate and wall plates, where the wall plates are disposed along an edge of the baseplate and provided with an opening, the opening forms the mounting portion, and the connecting assembly is inserted to the baseplate via the opening.

In one example, the electronic control device further includes a blocking assembly which is connected to the wall plates so as to block the opening; and the blocking assembly is provided with engaging grooves slidably connected to wall plates on two sides of the opening.

In one example, the connecting assembly includes a connection base and a conduction member disposed on the connection base, where the connection base is inserted to the baseplate, and the conduction member includes an electronic control conduction member and a power supply conduction member, which are conductively connected to each other; and a conductive limiting member is disposed on the power circuit board, where the conductive limiting member conductively mates with the electronic control conduction member and limits the power circuit board.

In one example, the conductive limiting member includes connection holes disposed on the power circuit board, and the electronic control conduction member is suitable for penetrating into the connection holes.

In one example, the mounting base further includes heat dissipation fins disposed on a side of the baseplate facing away from the electronic control assembly, and heat dissipation channels are formed between the heat dissipation fins.

In one example, part or all of the heat dissipation fins extend onto the wall plates to form flow guiding fins, flow guiding channels are formed between the flow guiding fins, and the flow guiding channels communicate with the heat dissipation channels.

DETAILED DESCRIPTION

It is to be noted that in the description of the present application, "first", "second", and "third" are only for description and not to be construed as indicating or implying relative importance.

Figure 1:
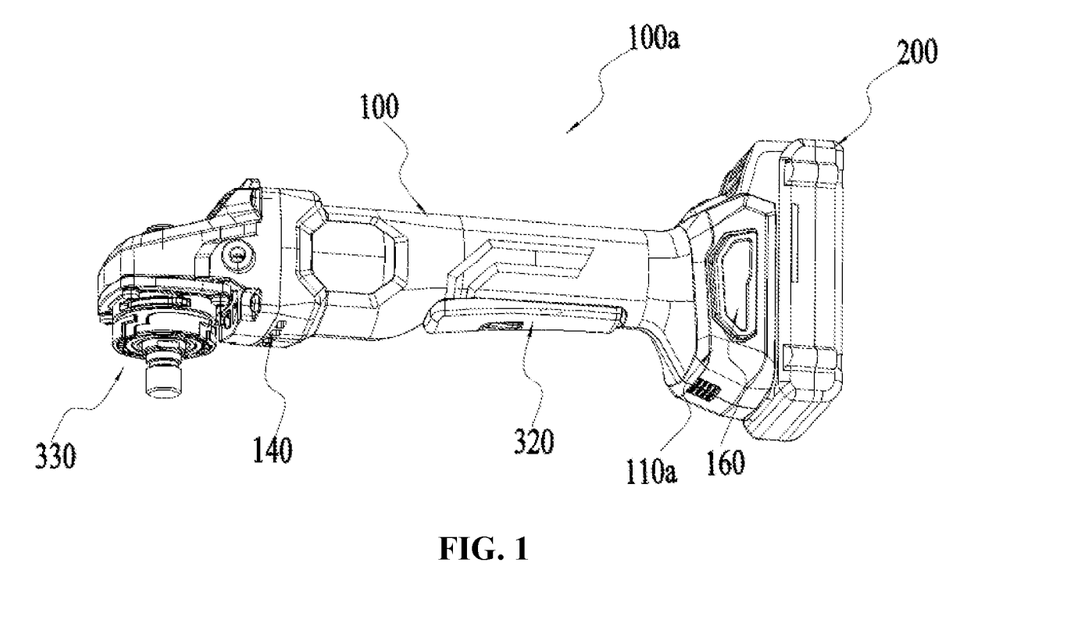
FIG. 1 is a structure view of a whole power tool according to an example.
Figure 2:
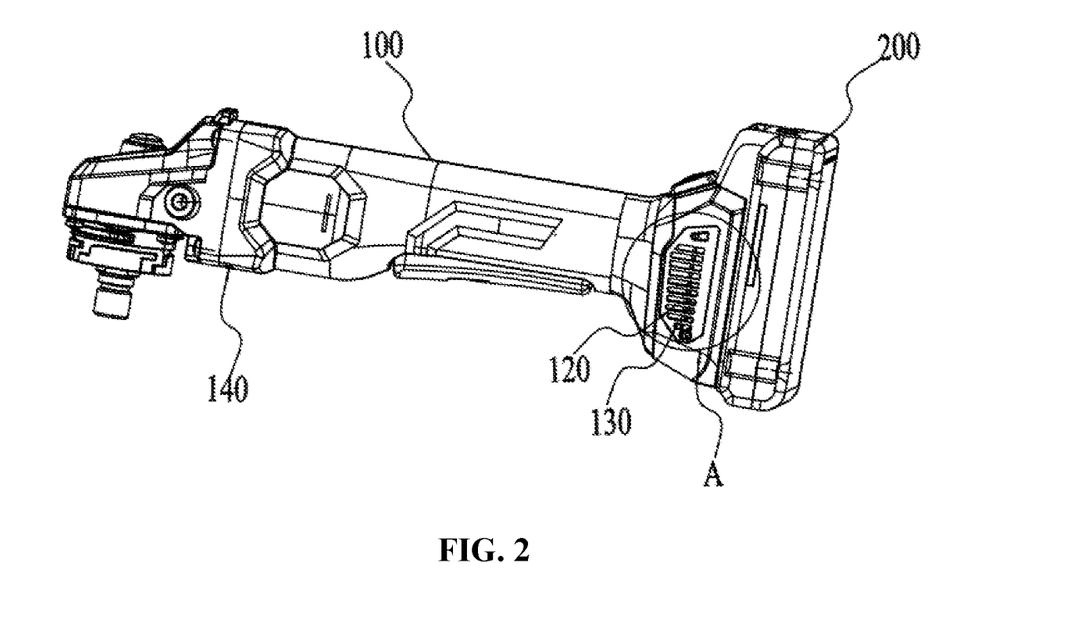
FIG. 2 is a structure view of the whole power tool shown in FIG. 1 with a filter screen at an air inlet removed.

As shown in FIGS. 1 and 2, a power tool 100a is described in the present application. In some examples, the power tool 100a is a handheld electric angle grinder including a main body 100 and a battery pack 200 which is detachably coupled to the main body 100.

Figure 5:
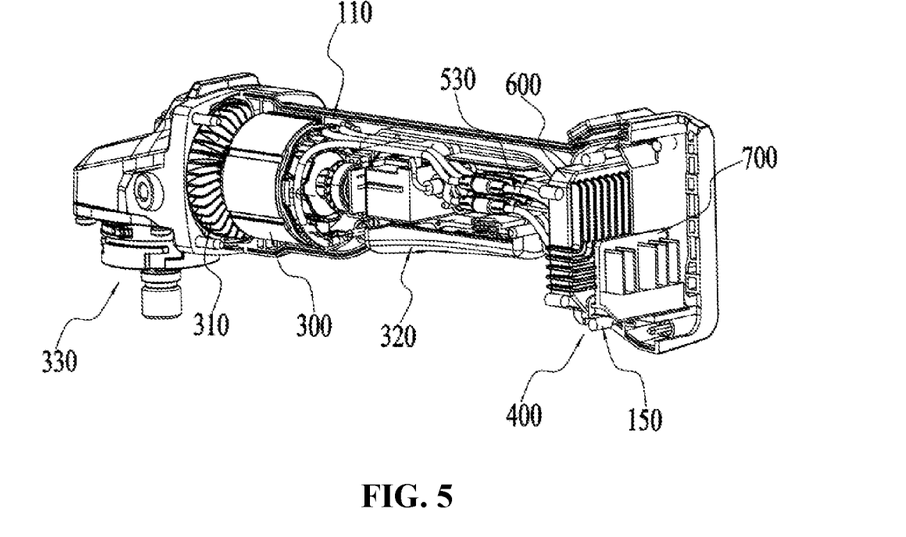
FIG. 5 is a structure view of a whole power tool with a battery pack and part of a housing of a main body removed.

As shown in FIG. 5, the main body 100 in the example of the present application includes a housing 110 and a motor 300, a fan 310, a switch assembly 320, and the like which are disposed in the housing 110. The motor 300 drives the fan 310 to rotate and supplies power to an output assembly 330.

Figure 4:
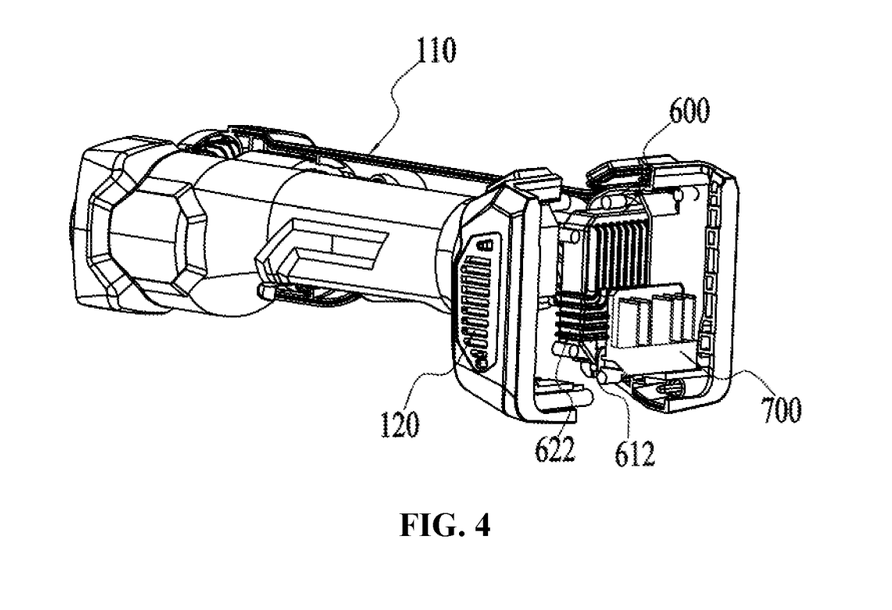
FIG. 4 is a structure view of a whole power tool with a housing of a main body opened.

Referring to FIGS. 2 and 4, the housing 110 is provided with an air inlet 120 and an air outlet 140. The fan 310 is used for generating an airflow and discharging the airflow out of the housing 110 of the tool. The fan 310 is disposed coaxially with the shaft of the motor 300 and rotates with the rotation of the motor 300. Optionally, referring to FIG. 1, the angle grinder in this example further has a detachable filter screen 160 disposed outside the air inlet 120 to prevent the entry of external dust.

The output assembly 330 includes an output shaft and a tool accessory mating with the output shaft. The tool accessory in this example includes a grinding disc (not shown in the figure).

Referring to FIG. 5, an electronic control device 400 disposed in the housing 110 is further included in this example, where the housing 110 includes a left housing and a right housing, the electronic control device 400 is clamped between stopper ribs of the left housing and the right housing, and the left housing and the right housing are fixed integrally by screws after they are engaged with each other.

Figure 6:
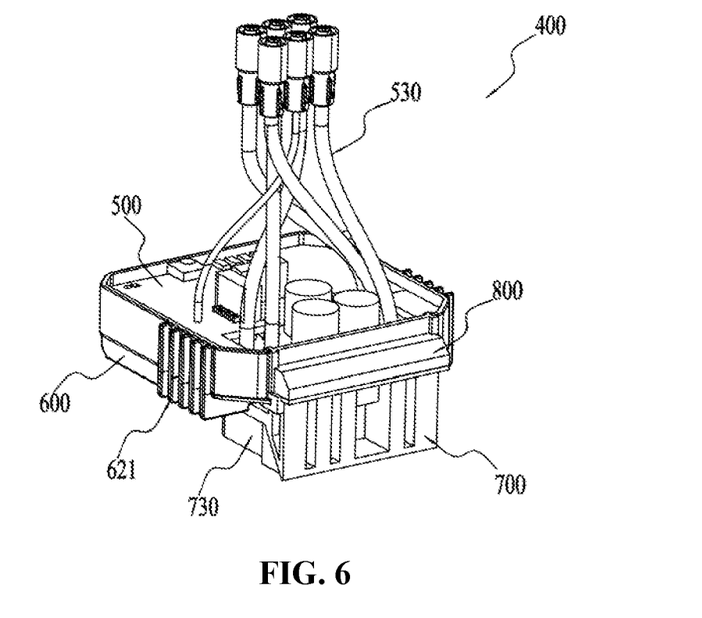
FIG. 6 is a structure view of an electronic control device after assembly according to an example.
Figure 7:
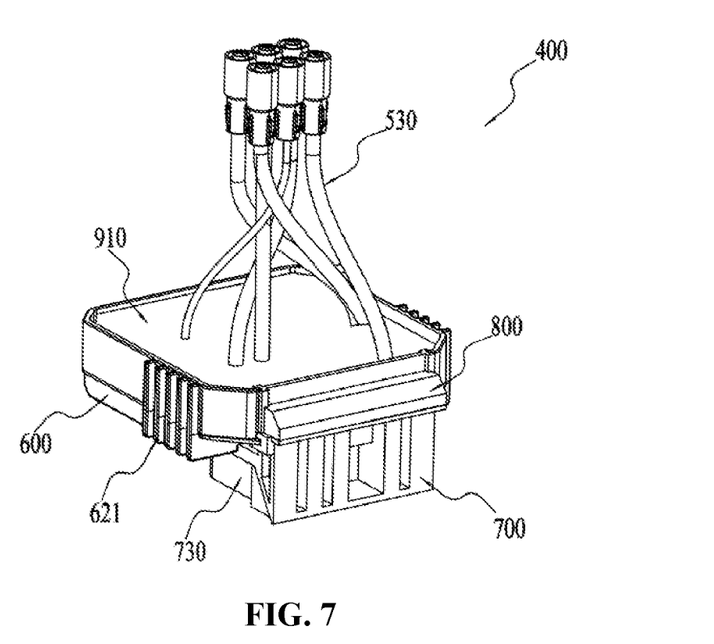
FIG. 7 is a structure view of the electronic control device in FIG. 6 after sealing.

As shown in FIGS. 5 and 6, the electronic control device 400 in this example is configured to connect the battery pack 200 and the electronic control device 400 is also electrically connected to the switch assembly 320 and the motor 300 separately through wires 530. The switch assembly 320 controls the motor 300 to be on or off so as to control a working state of the whole power tool 100a.

The housing 110 in this example includes a front end portion, a handheld portion, and a rear end portion. The motor 300, the fan 310, and the switch assembly 320 are disposed in the handheld portion, the output assembly 330 is disposed at the front end portion, and the electronic control device 400 is disposed in the rear end portion, where the rear end portion is an battery mounting portion 110a where the angle grinder is connected to the battery pack 200.

As shown in FIG. 6, the electronic control device 400 in this example includes an electronic control assembly 500, a mounting base 600, a connecting assembly 700, and a blocking assembly 800. The connecting assembly 700 conductively connects the battery pack 200 to the electronic control assembly 500. The mounting base 600 is provided with a mounting portion. The connecting assembly 700 mates with and is connected to the mounting base 600 via the mounting portion to form a mounting space 600a in which the electronic control assembly 500 is mounted.

Figure 10:
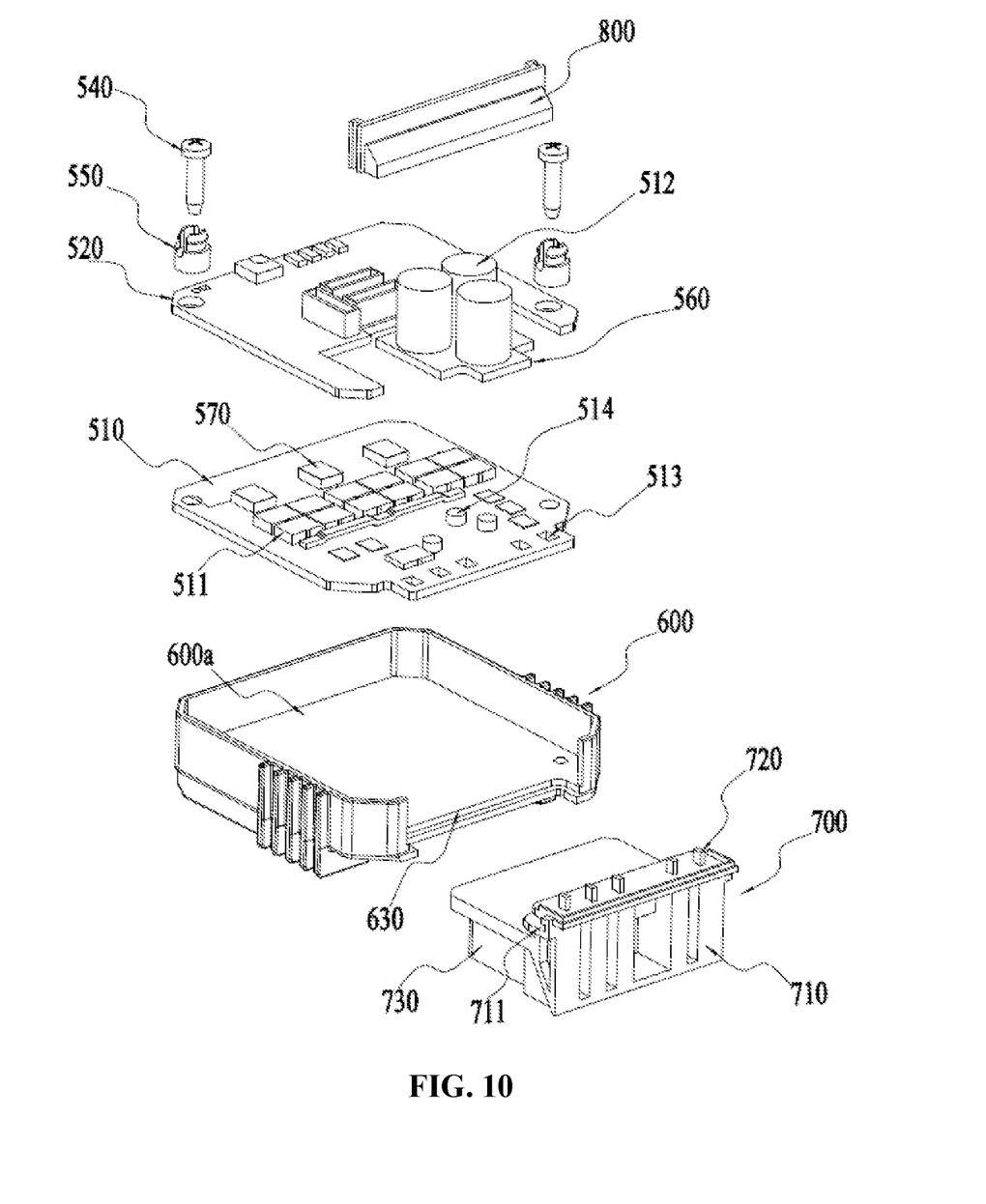
FIG. 10 is an exploded view of the electronic control device in FIG. 7.

Referring to FIG. 10, the electronic control assembly 500 includes a power circuit board 510 and a control circuit board 520, where the control circuit board 520 outputs control instructions to control the operation of the motor 300, and the power circuit board 510 and the control circuit board 520 are electrically connected to each other. As an alternative example, the electronic control device 400 may also include only one circuit board, that is, the power circuit board and the control circuit board are combined into one circuit board.

As shown in FIG. 10, the power circuit board 510 is provided with, for example, field-effect transistors 511 (metal-oxide-semiconductor (MOS) field-effect transistors) and capacitors 512, where the field-effect transistors 511 are configured to control a power supply and the motor 300 to be on or off according to control signals, and the capacitors 512 are disposed adjacent to the field-effect transistors 511 and integrated on the power circuit board 510 together with the field-effect transistors 511. The capacitors 512 are adjacent to the field-effect transistors 511 and disposed on the same circuit board as the field-effect transistors 511 so that the filtering performance of the capacitors 512 is improved.

A microcontroller such as a single-chip microcomputer is disposed on the control circuit board 520 and configured to detect and control an on/off state, a temperature, a current, and the like, so as to implement the control of the on/off state, over-temperature protection, and over-current protection.

The power circuit board 510 in this example is disposed adjacent to or abuts against the mounting base 600. The power circuit board 510 is an aluminum substrate. A printed circuit is formed and electronic elements are mounted on one surface of the aluminum substrate. The other surface of the aluminum substrate is a non-working surface. The non-working surface and the mounting base 600 are mounted on a baseplate 610 and in contact with the baseplate 610. Since the mounting base 600 and the power circuit board 510 are both made of aluminum with good thermal conductivity, heat generated by the field-effect transistors 511 on the power circuit board 510 can be transferred and dissipated in time, thereby improving the heat dissipation efficiency of the electronic control assembly 500.

As shown in FIG. 10, the control circuit board 520 and the power circuit board 510 in this example are stacked within the mounting base 600. The control circuit board 520 and the power circuit board 510 are pluggably connected to each other via electrical connectors, where an electrical connector is a small-sized board-to-board connector 570 in which small-sized pin headers which are conductively connected are disposed. For example, a socket is disposed on one of the circuit boards, and a plug mating with and connected to the socket is disposed on the other circuit board so that the power circuit board 510 and the control circuit board 520 can be stacked. Additionally, the combined height of the small-sized board-to-board connectors 570 after insertion does not exceed 4 mm. Since the combined height is relatively small, the height of wall plates 620 of the mounting base 600 can be reduced on the basis that the requirements for adhesive filling and sealing are met, thereby reducing the height of the mounting base 600.

At least two spacer columns 550 are further directly disposed between the control circuit board 520 and the power circuit board 510. The spacer columns 550 are mounted on the control circuit board 520 and configured to ensure a predetermined distance between the control circuit board 520 and the power circuit board 510, thereby avoiding the case where the control circuit board 520 exerts acting forces on electrical elements on the surface of the power circuit board 510, resulting in the failure and damage of the electrical elements.

The power circuit board is independently disposed and immediately adjacent to the mounting base, thereby ensuring the timely heat dissipation of the power circuit board. The control circuit board and the power circuit board are separately stacked on the mounting base, thereby reducing the size of board bodies and a bottom wall of the mounting base. The size of the mounting base is reduced, thereby facilitating the reduction of the size of the whole power tool 100a. Additionally, the electronic control device 400 can be mounted at the extending leg position without increasing the size of the extending leg of the whole power tool 100a.

Moreover, since the electronic control device is mounted in a grip handle of the housing and the size of the electronic control device is reduced, the size of the grip handle of the whole power tool 100a can be reduced, which is more convenient for an user to grip and provides better user experience.

The control circuit board 520 is directly inserted into and fixed onto the power circuit board 510, which is simple to operate, has a relatively low difficulty, and omits complicated processes such as wire soldering. Since the reliability of the connection through soldering is relatively low, the insertion through the board-to-board connectors 570 improves the reliability of the connection. In addition, the board-to-board connectors 570 are convenient to assemble, thereby facilitating the improvement of the capacity of a production line.

As an alternative example, the power circuit board and the control circuit board in this example may be connected to each other in other manners such as wires provided that the power circuit board and the control circuit board are conductively connected to each other.

Figure 8:
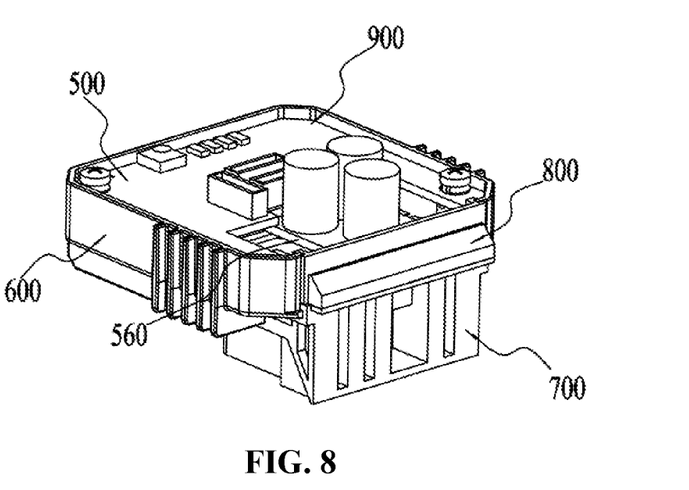
FIG. 8 is a structure view of the electronic control device in FIG. 6 with connection wires removed.
Figure 9:
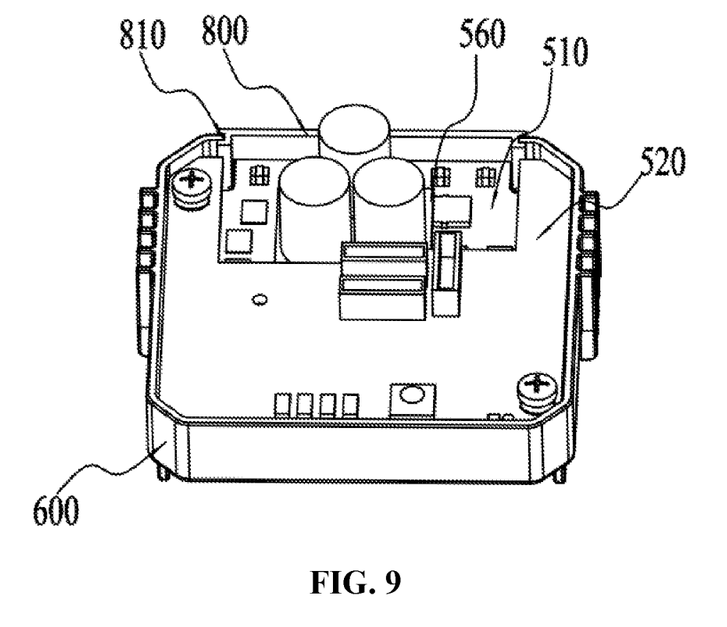
FIG. 9 is a structure view of FIG. 8 from another angle.

Referring to FIGS. 8 to 10, a capacitor circuit board 560 stacked on the power circuit board 510 is further provided in this example, and a projection of the capacitor circuit board 560 and a projection of the control circuit board 520 on the surface of the power circuit board 510 do not overlap each other. In this example, three capacitors 512 are soldered in parallel onto the capacitor circuit board, and then the capacitor circuit board 560 is soldered to the power circuit board 510. The capacitor circuit board 560 is provided with insertion holes and the power circuit board 510 is provided with copper support columns 514. During mounting, the three capacitors are fixed onto the capacitor circuit board through patch soldering, then the insertion holes on the capacitor circuit board are sleeved on the support columns on the power circuit board 510, and finally, the support columns on the power circuit board 510 are fixed through soldering. The capacitor circuit board is disposed, and the three capacitors are not directly mounted on the power circuit board 510 but soldered and fixed to the power circuit board 510 by means of the capacitor circuit board, thereby effectively reducing the size of the power circuit board, reducing the size of the mounting base, and facilitating the reduction of the size of the whole power tool 100a, for example, the reduction of the size of the extending leg.

Optionally, the number of capacitors is not limited to three and may be set according to specific requirements. The capacitor circuit board may also be soldered onto the control circuit board 520 through the patch soldering.

Figure 11:
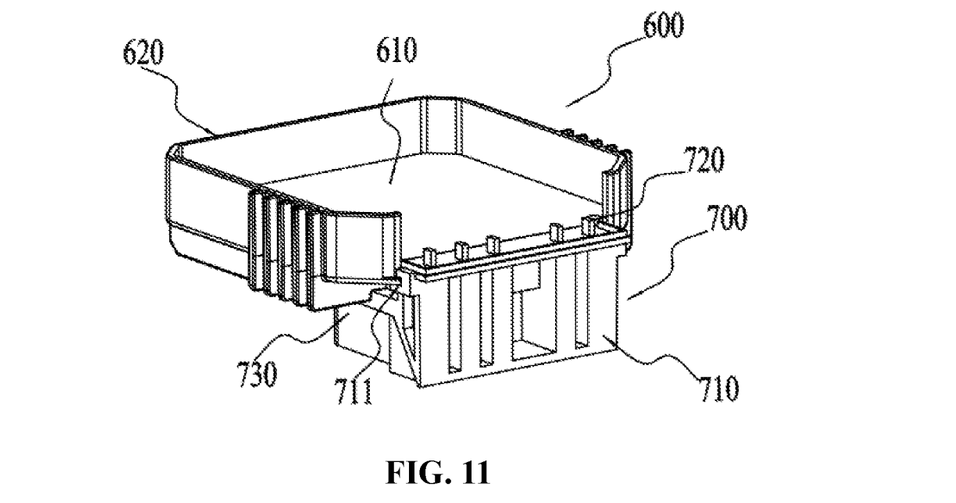
FIG. 11 is a schematic view showing the assembly of a mounting base and a connecting assembly according to an example.
Figure 12:
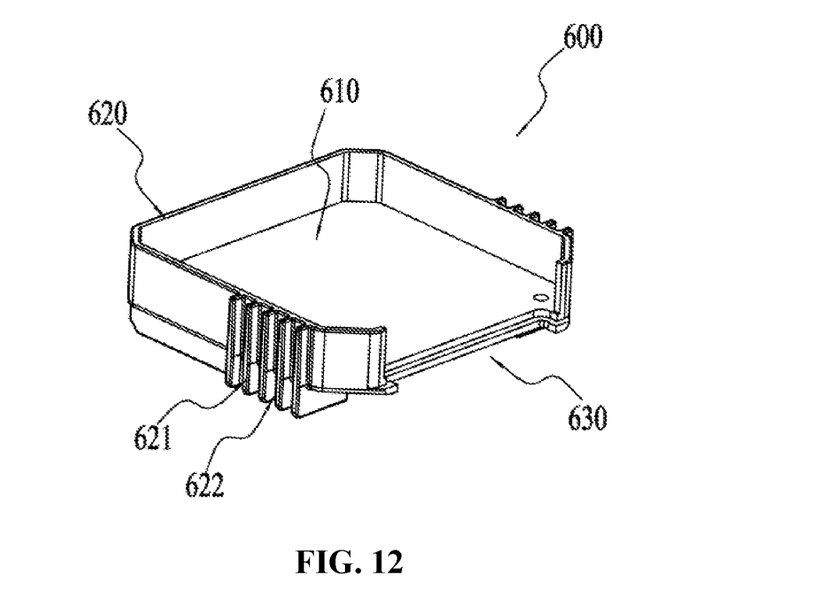
FIG. 12 is a structure view of a mounting base according to an example.
Figure 13:
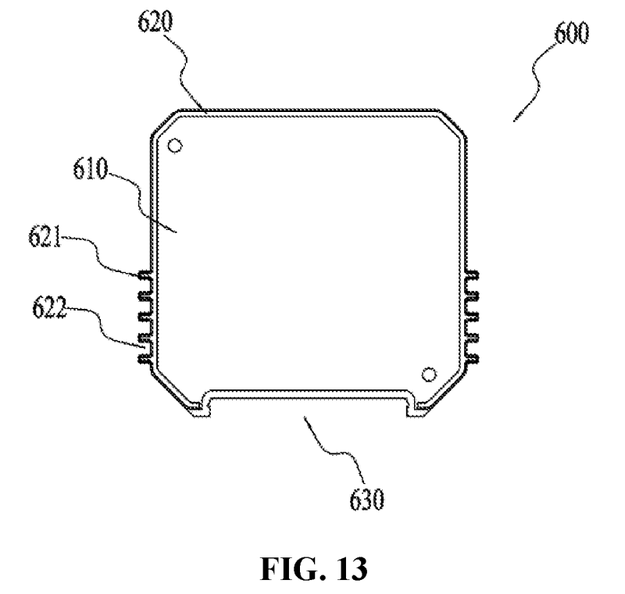
FIG. 13 is a top view of the mounting base shown in FIG. 12.

The mounting base 600 in this example dissipates heat from at least the power circuit board 510. As shown in FIGS. 11 to 13, the mounting base 600 includes the baseplate 610 and the wall plates 620. The wall plates 620 are disposed along an edge of the baseplate 610 and provided with an opening 630. The opening 630 forms the preceding mounting portion. The connecting assembly 700 is connected to the mounting base 600 via the opening 630.

The mounting base 600 is provided with the opening 630, and the connecting assembly 700 is inserted to the mounting base via the opening 630. The structure is simple and easy to assemble, and the assembly process flow is simplified on the basis that an integration degree is improved.

Figure 14:
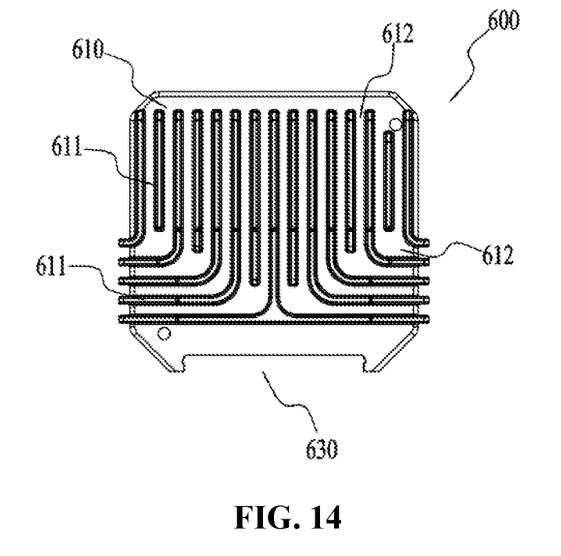
FIG. 14 is a bottom view of the mounting base shown in FIG. 12.

The mounting base 600 in this example further includes heat dissipation fins 611 and flow guiding fins 621. As shown in FIG. 14, the heat dissipation fins 611 are disposed on a side of the baseplate 610 facing away from the electronic control assembly 500, and heat dissipation channels 612 are formed between the heat dissipation fins 611.

Referring to FIGS. 12 to 14, in this example, part of the heat dissipation fins 611 extend onto the wall plates 620 to form the flow guiding fins 621. Flow guiding channels 622 are formed between the flow guiding fins 621. The flow guiding channels 622 communicate with the heat dissipation channels 612. An external airflow enters the flow guiding channels 622 through the air inlet 120 on the housing 110 of the main body and then enters the heat dissipation channels 612 through the flow guiding channels.

The heat dissipation fins 611 and the flow guiding fins 621 in this example are all ribs protruding from the mounting base 600. The mounting base 600 in this example is made of aluminum, and the heat dissipation fins 611 and the flow guiding fins 621 are integrally formed with the mounting base 600.

The heat dissipation fins are disposed on the baseplate which is in contact with the power circuit board so that the heat dissipation channels are formed, thereby improving the heat dissipation effect and the heat dissipation efficiency and implementing the effective heat dissipation of power elements. The flow guiding fins and the flow guiding channels are disposed so that the external airflow can be smoothly guided into the tool in a timely and effective manner, thereby increasing the circulation speed of the airflow on the back of the mounting base, improving the heat dissipation effect, and ensuring the electrical performance of the circuit.

As an alternative example, all the heat dissipation fins 611 may be configured to extend onto adjacent wall plates 620 to form the flow guiding fins 621.

As another alternative example, the heat dissipation fins 611 and the flow guiding fins 621 independent of each other may be disposed on the baseplate 610 and the wall plates 620, respectively provided that the flow guiding channels formed by the flow guiding fins are separately docked with the air inlet and the heat dissipation channels.

The flow guiding channels 622 guide the external airflow into the housing 110 and also carry away the heat on the wall plates 620 at the same time so that the flow guiding channels 622 also dissipate heat. In addition, curved transition sections exist at the positions where the direction of the heat dissipation fins 611 and the direction of the flow guiding fins 621 change, so as to facilitate the smooth flow of the airflow.

The direction of the outlet of the heat dissipation channels 612 may be set along the direction of the flow path of a heat dissipation airflow in the housing 110, so as to guide the airflow in the heat dissipation channels 612 to smoothly move along the flow path of the heat dissipation airflow in the main body 100, thereby avoiding the case where the circulation of the heat dissipation airflow in the whole power tool 100a is affected due to different directions.

Figure 3:
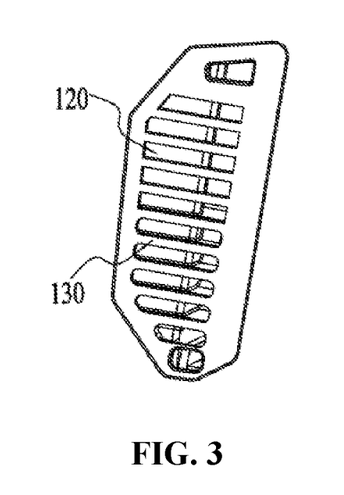
FIG. 3 is a partial enlarged view of a part A shown in FIG. 2.

As shown in FIGS. 2 to 4, guiding ribs 130 are disposed at the air inlet 120 in this example, where the flow guiding fins 621 and the guiding ribs 130 in this example are correspondingly disposed so that the air inlet 120 is docked with the flow guiding channels 622. Thus, it is ensured that external air can directly enter the flow guiding channels 622 via the air inlet 120 and quickly enters the heat dissipation channels 612 through the flow guiding channels 622 so as to facilitate the rapid and smooth circulation of a cooling airflow in the housing 110 of the whole power tool 100a, thereby quickly removing the heat generated on the power circuit board 510 and improving the heat dissipation efficiency.

Figure 15:
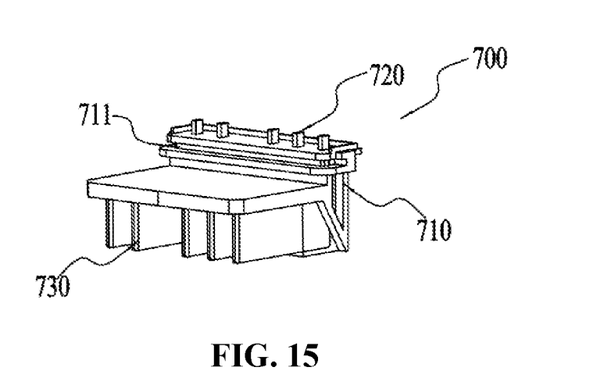
FIG. 15 is a structure view of a connecting assembly according to an example.
Figure 16:
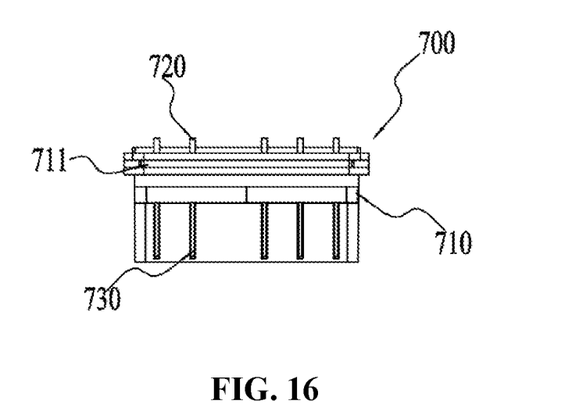
FIG. 16 is a front view of the connecting assembly in FIG. 15.

As shown in FIG. 15, the connecting assembly 700 in this example includes a conduction member and a connection base 710. The conduction member is disposed on the connection base 710. Referring to FIG. 11, the connection base 710 is inserted to the baseplate 610 of the mounting base 600 via the opening 630.

As shown in FIGS. 15 to 18, in this example, an engaging groove 711 adapted to the baseplate 610 is disposed on the connection base 710. The connection base 710 is inserted to the mounting base 600 along a direction parallel to a surface of the baseplate 610, where the baseplate 610 is inserted into the engaging groove 711. After the connection base 710 is inserted in place relative to the mounting base 600, the connection base 710 mates with and is connected to the mounting base 600 to form the mounting space 600a for the power circuit board 510 and the control circuit board 520.

Figure 17:
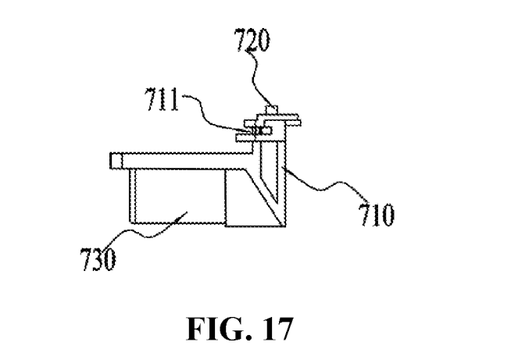
FIG. 17 is a right view of the connecting assembly in FIG. 15.
Figure 18:
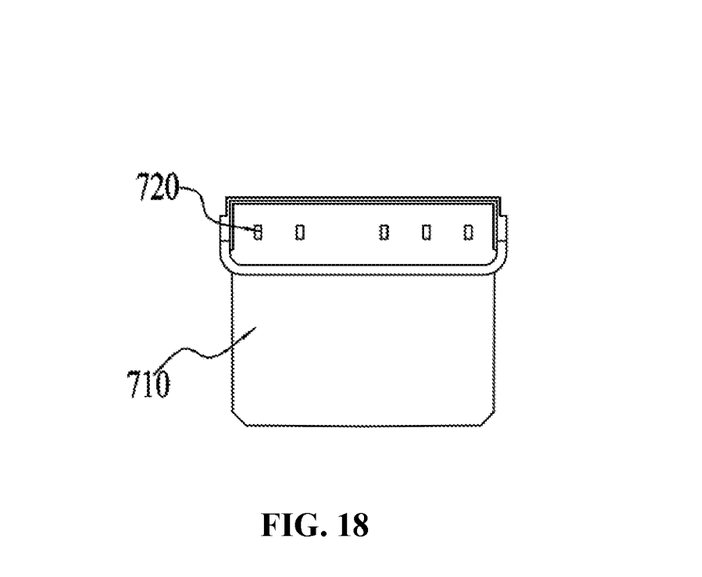
FIG. 18 is a top view of the connecting assembly in FIG. 15.

The conduction member in this example conductively connects the battery pack 200 to the electronic control assembly 500, where the conduction member includes an electronic control conduction member and a power supply conduction member, which are conductively connected to each other. Referring to FIGS. 15 and 17, the electronic control conduction member includes conductive terminals 720 disposed at one end of the connection base 710 and exposed outside the connection base 710. The conductive terminals 720 are configured to be conductively connected to the electronic control assembly 500. The power supply conduction member includes conductive insertion pieces 730 disposed at the other end of the connection base 710 and exposed outside the connection base 710. The conductive insertion pieces 730 are configured to be conductively connected to connection terminals of the battery pack 200. Referring to FIG. 11, after the connection base 710 is assembled to the baseplate 610 of the mounting base 600, the conductive terminals 720 and the conductive insertion pieces 730 are respectively disposed on two sides of the baseplate 610.

During use, the battery pack is plugged along the guiding ribs of the main body and conductively connected to the conductive terminals 720. Referring to FIG. 5, the conductive insertion pieces 730 of the electronic control device 400 in this example need to be inserted to the battery pack. Therefore, the control circuit board 520, the power circuit board 510, and the baseplate 610 of the mounting base 600 in this example are substantially parallel to the direction in which the battery pack is plugged or unplugged. For example, the rear end portion of the housing 110 includes a plugging/unplugging surface which pluggably mates with the battery pack 200, and the power circuit board 510, the control circuit board 520, and the baseplate 610 of the mounting base 600 are disposed parallel to the plugging/unplugging surface. Since the preceding configurations in the present application reduce the size of the power circuit board 510, the electronic control device 400 can be mounted at the extending leg position without increasing the size of the extending leg of the whole power tool 100a.

The power circuit board 510 in this example is further provided with a conductive limiting member which conductively mates with the conductive terminals 720 and limits the power circuit board 510. For example, referring to FIG. 10, the conductive limiting member includes connection holes 513 disposed on the power circuit board 510, where the power circuit board 510 is docked with the conductive terminals 720 through the connection holes 513 and then is fixed and conductively connected to the conductive terminals 720 through soldering.

As shown in FIG. 10, during assembly, the conductive terminals 720 penetrate into the power circuit board 510 along an axial direction of the conductive terminals 720 and then the power circuit board 510 is fixed onto the baseplate 610 of the mounting base 600 through screws 540. Two screws 540 sequentially penetrate through the control circuit board, the spacer columns 550, and the power circuit board 510 and then are fixed to the mounting base 600. Since the preceding connection holes 513 are disposed, the power circuit board 510 is automatically guided and positioned during mounting, thereby simplifying the assembly operation flow of the power circuit board 510 and improving the capacity of the production line.

As shown in FIGS. 7 to 10, the electronic control device 400 in this example further includes the blocking assembly 800 which is connected to the wall plates 620 so as to block the opening 630. Referring to FIG. 9, after the blocking assembly 800 is assembled to the mounting base 600, one end portion of the blocking assembly 800 abuts against the power circuit board 510 and the connection base 710, and the other end portion of the blocking assembly 800 is substantially flush with end portions of wall plates 620 on two sides of the blocking assembly 800. In this case, after the blocking assembly 800 is assembled to the mounting base 600, an inner wall of the blocking assembly 800, the wall plates of the mounting base 600, and the surface of the electronic control assembly enclose and form an adhesive filling cavity 900.

Figure 19:
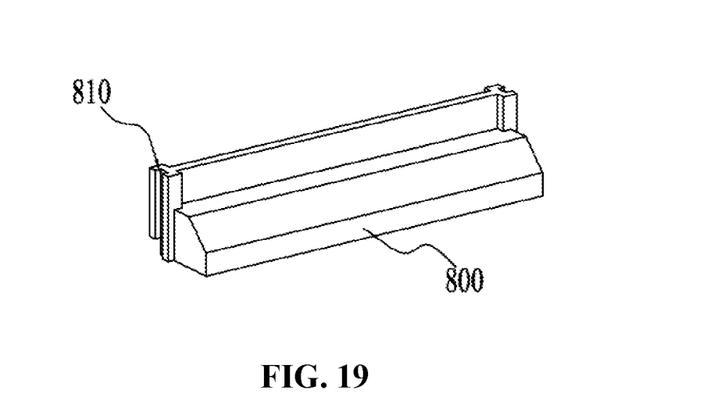
FIG. 19 is a structure view of a blocking assembly according to an example.

Referring to FIGS. 9 and 19, sliding grooves 810 are respectively disposed on the two sides of the blocking assembly 800, and the blocking assembly 800 is slidably inserted to the wall plates 620 on two sides of the opening 630. During assembly, the blocking assembly 800 is inserted along a direction parallel to the wall plates 620 and finally abuts against the surface of the power circuit board 510. Then, an adhesive is injected for electronic elements in the adhesive filling cavity 900 to form a sealant layer 910. The sealant layer 910 encapsulates exposed conductive pins of the elements, thereby sealing the electronic elements. Generally, a sealant is an epoxy resin so as to implement the water resistance, dust resistance, anti-corrosion, sealing, and heat conduction of electrical elements, thereby ensuring the mechanical strength of the whole power tool 100a and avoiding the degradation of the electrical performance. The sliding grooves slidably connected to the wall plates are disposed on the blocking assembly so that the blocking assembly is slidably connected to the wall plates. The blocking assembly is simple to connect and easy to assemble, thereby simplifying an assembly process.

In this example, a displacement compensation assembly 150 is further disposed on an inner wall of the rear end portion of the housing 110, where the displacement compensation assembly 150 is disposed at a position where the inner wall of the housing 110 is in contact with the electronic control device 400. For example, referring to FIG. 5, the displacement compensation assembly 150 may be an elastic washer or an elastic gasket. Since the electronic control device 400 in this example is directly integrated with the conductive insertion pieces 730 and compared with the wire connection, the connection between the conductive insertion pieces 730 and the battery pack 200 in this example is a hard connection, the elastic displacement compensation assembly 150 is disposed so that the electronic control device 400 can be elastically in contact with the inner wall of the housing 110, so as to avoid the case where the conductive insertion pieces 730 move with respect to an interface of the battery pack 200 due to vibration during the use of the tool, resulting in the poor contact between the conductive insertion pieces 730 and the battery pack 200 or a damaged interface. When vibration occurs during the use of the tool, the electronic control device 400 can make small displacement compensation through the displacement compensation assembly 150 so as to prevent a relatively large movement of the conductive insertion pieces 730 with respect to the interface of the battery pack 200, thereby prolonging the service life of the tool and improving user experience.

As an alternative example, the electronic control device in this example is also applicable to other handheld power tool 100 as whose working current is 20 A to 45 A and whose maximum allowable working current is about 65 A, such as electric drills, screwdrivers, sanders, wrenches, polishers, gun drills, electric hammers, and electric picks.

In the present application, the connecting assembly, the electronic control assembly, and the mounting base are integrated into a whole so that the electronic control device can not only implement the connection between the main body and the power supply but also implement the heat dissipation of the electronic control assembly, which integrates the electricity conduction for the power supply, control, and heat dissipation, thereby improving the integration degree, reducing the occupied space, and facilitating the reduction of the size of the whole power tool 100a. On the other hand, the electronic control device has relatively great versatility and relatively high adaptability so that it is applicable to other similar tools.

A method for assembling the electronic control device in this example is described below.

(1) The connecting assembly and the mounting base are assembled so that the mounting space 600a for the electronic control assembly is formed.

The connection base 710 of the connecting assembly 700 is inserted to and fixed onto the baseplate 610 of the mounting base 600 via the opening 630 of the mounting base 600 so that the baseplate 610 of the mounting base is inserted into the engaging groove 711 of the connection base 710, where the connecting assembly is inserted to the mounting base 600 along the direction parallel to the baseplate 610 of the mounting base.

(2) The electronic control assembly is mounted and fixed in the mounting space 600a.

The conductive terminals 720 of the connecting assembly are inserted, and the power circuit board 510 is fixed onto the baseplate 610 of the mounting base, where the power circuit board 510 is mounted onto the mounting base 600 along the direction perpendicular to the baseplate 610 of the mounting base and the power circuit board 510 is fixedly connected to the baseplate 610 through the screws 540 after it is mounted in place.

The control circuit board 520 of the electronic control assembly is conductively connected to the power circuit board 510.

The plug of the control circuit board 520 is inserted into the socket of the power circuit board 510, or the plug of the power circuit board 510 is inserted into the socket of the control circuit board 520.

(3) The opening 630 of the mounting base 600 is blocked.

The wall plates 620 are inserted into the sliding grooves 810 of the blocking assembly 800 along the direction perpendicular to the baseplate 610. After the blocking assembly 800 is inserted in place to the wall plates 620, the blocking assembly 800 blocks the opening 630.

(4) The electronic control assembly is sealed.

The adhesive is injected into the adhesive filling cavity which is enclosed and formed by the blocking assembly 800 and the mounting base 600 so that the sealant layer 910 is formed.

After the electronic control device 400 is assembled, the electronic control device 400 is mounted into the housing of the main body 100 through the steps below.

A predetermined number of displacement compensation assembly 150 are preset at the position where the inner wall of the housing 110 is in contact with the electronic control device 400. For example, elastic washers or elastic gaskets are clamped into preset engaging grooves.

The electronic control device 400 is mounted in the left housing or the right housing and fixed by the stopper ribs on the inner wall of the housing and extending wires on the electronic control device 400 are fixedly connected to the switch assembly 320 or the motor 300. For the manners of mounting other structural members in the main body 100, reference may be made to the related art and details are not repeated here.

The other housing and the preceding housing are engaged with each other and fixed and locked through screws.

According to the present application, the mounting base is provided with the opening through which the connecting assembly is allowed to be inserted so that the connecting assembly and the mounting base are assembled through simple insertion. After the assembly is completed, the conductive terminals penetrate into the power circuit board and the power circuit board is fixed to the mounting base. Since the conductive terminals on the connecting assembly guide and limit the power circuit board during its assembly, the assembly difficulty of the power circuit board is reduced, and the convenience and accuracy of operating the power circuit board are increased. Finally, assembly efficiency and the capacity are improved.

What is claimed is:

1. A power tool, comprising:
a main body comprising a housing and a motor, a switch assembly, and an electronic control device which are mounted in the housing, wherein the electronic control device is electrically connected to the switch assembly and the motor, separately; and
a battery pack detachably coupled to the main body and having a connection state in which the battery pack is electrically conductive with the electronic control device and a separate state in which the battery pack is disconnected from the electronic control device;
wherein the electronic control device comprises:
an electronic control assembly comprising a power circuit board;
a mounting base provided with an opening; and
a connecting assembly for conductively connecting the battery pack to the electronic control assembly, connected to the mounting base via the opening, and mating with the mounting base to form a mounting space in which the electronic control assembly is mounted,
wherein the connecting assembly comprises a connection base and a conduction member disposed on the connection base, the connection base is pluggably connected to a baseplate via the opening, and the conduction member is configured to connect the electronic control device to the battery pack.

2. The power tool according to claim 1, wherein the electronic control assembly further comprises a control circuit board, and the control circuit board and the power circuit board are stacked within the mounting base.

3. The power tool according to claim 1, wherein the mounting base comprises wall plates coupled to the baseplate, and the wall plates are disposed along an edge of the baseplate and provided with the opening.

4. The power tool according to claim 1, wherein the conduction member comprises an electronic control conduction member and a power supply conduction member, which are conductively connected to each other; and a conductive limiting member is disposed on the power circuit board, and the conductive limiting member conductively mates with the electronic control conduction member and limits the power circuit board.

5. The power tool according to claim 3, wherein the electronic control device further comprises a blocking assembly which is connected to the wall plates so as to block the opening, and the blocking assembly is provided with engaging grooves slidably connected to the wall plates on two sides of the opening.

6. The power tool according to claim 5, wherein the mounting base further comprises heat dissipation fins disposed on a side of the baseplate facing away from the electronic control assembly, and heat dissipation channels are formed between the heat dissipation fins.

7. The power tool according to claim 6, wherein part or all of the heat dissipation fins extend onto the wall plates to form flow guiding fins, flow guiding channels are formed between the flow guiding fins, and the flow guiding channels communicate with the heat dissipation channels.

8. The power tool according to claim 7, wherein the housing is provided with an air inlet and an air outlet, and the flow guiding channels on the mounting base are docked with the air inlet.

9. The power tool according to claim 1, further comprising a displacement compensation assembly disposed between an inner wall of the housing and the electronic control device.

10. The power tool according to claim 1, wherein the power circuit board is made of a metal substrate.

11. The power tool according to claim 1, wherein the power circuit board is in contact with the mounting base.

12. The power tool according to claim 1, wherein the mounting base is a metal base.

13. The power tool according to claim 1, wherein the electronic control assembly further comprises a control circuit board, and the control circuit board and the power circuit board are pluggably connected to each other via electrical connectors.

14. The power tool according to claim 1, wherein the electronic control device is arranged at an battery mounting portion where the power tool is connected to the battery pack.

15. A power tool, comprising:
a main body comprising a housing and a motor, a switch assembly, and an electronic control device which are mounted in the housing, wherein the electronic control device is electrically connected to the switch assembly and the motor, separately; and
a battery pack detachably coupled to the main body and a connection state in which the battery pack is electrically conductive with the electronic control device and a separate state in which the battery pack is disconnected from the electronic control device;
wherein the electronic control device comprises:
an electronic control assembly comprising a power circuit board;
a mounting base for dissipating heat from at least the power circuit board and provided with a mounting portion; and
a connecting assembly for conductively connecting the battery pack to the electronic control assembly and mating with and connected to the mounting base via the mounting portion to form a mounting space in which the electronic control assembly is mounted, wherein the connecting assembly comprises a connection base and a conduction member disposed on the connection base, the connection base is pluggably connected to a baseplate via an opening in the mounting base, and the conduction member is configured to connect the electronic control device to the battery pack.

16. The power tool according to claim 1, wherein the electronic control assembly further comprises a control circuit board, the control circuit board and the power circuit board are stacked within the mounting base, and the power circuit board is in contact with the mounting base.

17. The power tool according to claim 16, wherein the control circuit board and the power circuit board are pluggably connected to each other via electrical connectors.

18. The power tool according to claim 15, wherein the mounting base comprises wall plates disposed along an edge of the baseplate and defining the opening, the opening forms the mounting portion, and the connecting assembly is pluggably connected to the baseplate via the opening.

19. An electronic control device, comprising:
   an electronic control assembly comprising a power circuit board;
   a mounting base for dissipating heat from at least the power circuit board and provided with a mounting portion; and
   a connecting assembly for conductively connecting a battery pack to the electronic control assembly and mating with and connected to the mounting base via the mounting portion to form a mounting space in which the electronic control assembly is mounted,
   wherein the connecting assembly comprises a connection base and a conduction member disposed on the connection base, the connection base is pluggably connected to a baseplate via an opening in the mounting base, and the conduction member is configured to connect the electronic control device to the battery pack.

* * * * *